356-138. SR 8-14-73 XR 3,752,589

United States Patent [19]

Kobayashi

[11] 3,752,589

[45] Aug. 14, 1973

[54] METHOD AND APPARATUS FOR POSITIONING PATTERNS OF A PHOTOGRAPHIC MASK ON THE SURFACE OF A WAFER ON THE BASIS OF BACKSIDE PATTERNS OF THE WAFER

[76] Inventor: Masaaki Kobayashi, 2808 Sagoa, Kawasaki-shi, Japan

[22] Filed: Oct. 26, 1971

[21] Appl. No.: 192,395

Related U.S. Application Data

[63] Continuation-in-part of Ser. No. 835,336, June 23, 1969, abandoned.

[52] U.S. Cl. .................. 356/172, 356/138, 356/171, 350/30, 350/81

[51] Int. Cl. .......................................... G01b 11/26

[58] Field of Search ................ 350/30, 81; 356/172, 356/168, 162, 156, 153, 138, 171

[56] References Cited

UNITED STATES PATENTS 3,442,583 5/1969 Rottmann .......................... 356/138

3,490,846 1/1970 Kasper ................................ 350/81

3,499,714 3/1970 Schellenberg...................... 356/138

*Primary Examiner*—Ronald L. Wibert

*Assistant Examiner*—Paul K. Godwin

*Attorney*—Robert E. Burns et al.

[57] ABSTRACT

In the fabrication of a semiconductor device, an operation for positioning patterns of a photographic mask on the surface of a wafer with reference to metal-placed patterns on the underside of the wafer is remarkably improved by means of a microscopical method utilizing at least one pair of object lenses facing each other so that corresponding images of the basic patterns of the wafer and images of patterns of the photographic mask are taken separately, whereupon these images are then optically superimposed and observed. The metal-plated patterns are illuminated at an angle of incidence greater than zero in order to prevent reflective disturbance due to the support device for the wafer and the position of the photographic mask relative to the wafer is accurately adjusted while observing the above-mentioned combined images.

12 Claims, 5 Drawing Figures

METHOD AND APPARATUS FOR POSITIONING PATTERNS OF A PHOTOGRAPHIC MASK ON THE SURFACE OF A WAFER ON THE BASIS OF BACKSIDE PATTERNS OF THE WAFER

This is a continuation-in-part application of Ser. No. 835,336 filed June 23, 1969, now abandoned.

The present invention relates to an improved method and apparatus for positioning patterns of a photographic mask on the surface of a wafer, such as a semiconductor wafer, in relation to metal-plated patterns on the underside of the wafer.

In the case of fabricating a semiconductor device, after positioning a photographic mask on a wafer covered with a photosensitive emulsion, the wafer is exposed to ultraviolet rays through the photographic mask and then the emulsion is developed and the unexposed emulsion is washed away with solvent, Then the wafer is subjected to a successive etching process and the photoresist protects the surface of the wafer from etching. The required mask regions muste be formed at correct positions on the wafer, and the superimposition of the photographic mask on the wafer must be carried out correctly so that the patterns of the photographic mask superpose accurately on the required regions of the wafer. Generally, the positioning of the photographic mask on the wafer is carried out by means of superimposition of the mask on a facing surface of the wafer. In this case, if the basic patterns exist on the underside surface of the wafer it is very difficult to carry out the above-mentioned positioning operation accurately, because the wafer generally is not transparent to visible rays.

A conventional technique for carrying out the above-mentioned positioning operation is performed by projecting infrared rays from the underside of the wafer whle observing the patterns by an infrared microcscope. In this method, it is required to apply a device for converting infrared rays to visible rays, so that the equipment as a whole becomes large. Furthermore, the resolving power of an infrared microscope is generally unsatisfactory for accurately carrrying out the above-mentioned positioning operation, and it is impossible to focus the microcope lens simultaneously on patterns positioned with an intervening space in the practice of this method. Also, the infrared microscopic method can not be applied in fabricating a semiconductor wafer using material covered by a substance such as a metallic film which is opaque to infrared rays.

The principal object of the present invention is to provide a method and apparatus for positioning patterns of a photographic mask on a wafer, such as a semiconductor wafer, in relation to metal-plated patterns on the underside of the wafer, thereby the above-mentioned drawbacks of the conventional method can be completely eliminated.

A further object of the present invention is to provide a practical and compact apparatus which can be operated very easily and accurately to attain the above-mentioned principal object of the present invention.

Further features and advantages of the invention will be apparent from the ensuing description with reference to the accompanying drawings in which the scope of the invention is in no way limited.

Figure 1:
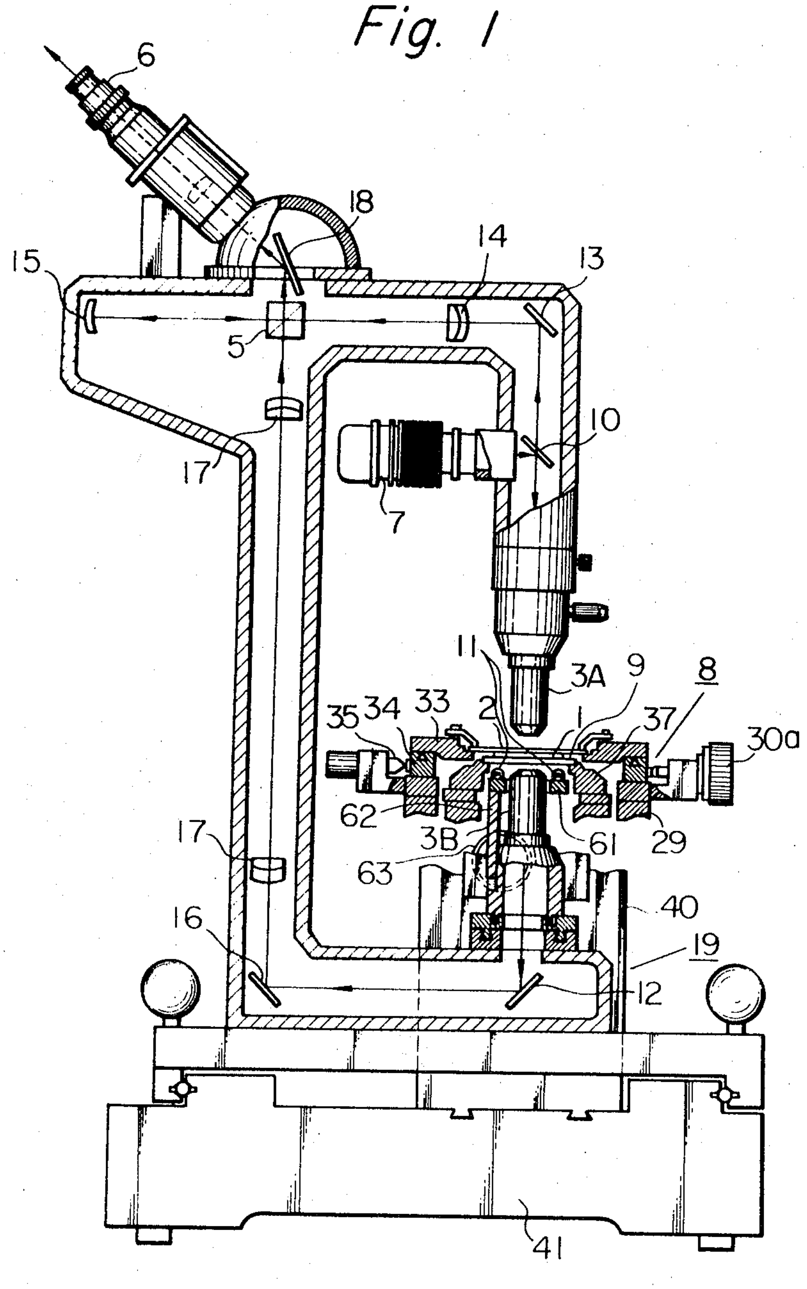
FIG. 1 is a side view, partly in section of an embodiment of the apparatus of the present invention.

As is clearly shown in FIG. 1, the apparatus of the invention comprises a pair of object lenses (upper and lower lenses), aligned along a common axis and facing each other, reflex mirrors for reflecting images from the object lenses, mirror means for combining images from the object lenses, an eyepiece lens for enlarging the combined image from the mirror means, a light source for illuminating the object of the upper object lens along the axis of the upper object lens, a light source for illuminating the object of the lower object lens and disposed off the axis of the lower object lens so as to project the illumination light at an incident angle greater than zero, and means for adjusting the relative positions of the viewed objects so as to accurately superimpose those images at a predetermined position. A wafer provided with a metal-plated pattern on the underside thereof and a photographic mask provided with a pattern corresponding to the metal-plated pattern are superposed with an intervening space, these objects are mounted at a position between the lenses and patterns of these objects are observed by the corresponding lenses. Images of these patterns are taken separately by the object lenses and combined at almost equal magnification so that a combined image is observed by the eye piece lens. While adjusting the relative positions of these patterns by an adjusting means, the superposed positions of these objects are fixed when it is observed that these patterns are superposed at a desired condition.

Referring particularly to FIG. 1, a device 8 for adjusting the position of the photographic mask relative to the wafer is disposed between a pair of upper and lower object lenses 3A and 3B which face each other, a wafer 1 is mounted on a transparent glass 9 supported by a first supporting means disposed on the adjusting device 8 and a photographic mask 2 is supported by a second supporting means movably mounted on the adjusting device 8 so that the second supporting means is superposed above the first supporting means. The wafer is covered at its upper side by a photosensitive emulsion. Illumination of the pattern on the photographic mask 2 is carried out by a light source 7 disposed on an arm supporting the object lens 3A and a semi-transparent reflection glass 10 located on the axis of the upper object lens 3A. Illumination of the pattern on the under surface of the wafer 1 is directly carried out by light sources 11 disposed off the axis of the lower object lens 3B. Accordingly, the angle of incidence of the illumination light projected from the light sources 11 is greater than zero. The term "angle of incidence" used herein refers to the angle between a line normal to the object surface and the axis of the projected light. The supporting arms of the object lenses 3A and 3B are provided with L shaped hollow tubes as shown in FIG. 1, which tubes are connected with one another at their ends. The indication of the hollow tubes in the following illustration with respect to elements of the optical means of the apparatus disposed in these hollow tubes, may be sometimes omitted, because it can be clearly understood from the positions of these elements in FIG. 1. An image of the patterns of the photographic mask 2 is reflected by a reflection mirror 13 and passes through a collection lens 14 and a semi-transparent mirror 5, and is reflected again by a reflective mirror 15 and projected to the semi-transparent mirror 5. On the other hand, an image of the basic patterns of the wafer 1 is reflected by reflection mirrors 12 and 16 and passes through an optical means 17 for collecting the image so that the image is enlarged to the same configuration as the image of the patterns of the photographic mask 2 and is projected to the semi-transparent mirror 5. Therefore, these images of two different patterns are combined by means of the semi-transparent mirror 5. The combined image is reflected by a reflection mirror 18 and then the enlarged combined image is observed by an eyepiece lens 6. Therefore, it is possible to observe the relative position of these patterns by the above-mentioned observation of the combined image. The relative positions of these patterns can be corrected by means of the device 8 for adjusting the position of the photographic mask 2 relative to the wafer 1. When the image of the photographic mask 2 is accuraely superposed above the image of the basic patterns of the wafer 1 by the above-mentined adjustment of the relative positions thereof, the supporting position of the photographic mask 2 is fixed, as hereinafter illustrated and then the mask 2 is attached to the wafer 1. Next, the wafer 1 and the mask 2 are transferred together to a working position of an exposure device (not shown) which is attached to the microscope by means of operating a displacing means represented by 19, and thereafter the wafer 1 is illuminated through the photographic mask 2 so that all of the emulsion, except in the required regions, is exposed to the light. In this case, the adjusting device 8 is rigidly supported by the displacing means 19 which slidably dovetails with a base 41 of the whole apparatus so that the displacing means can be moved perpendicularly as shown in FIG. 1.

In the apparatus of the present invention, it is important that the light source 11 is located at a position spaced from the axis of the lower object lens 3B and facing the underside of the wafer so as to illuminate the metal-plated patterns at an angle of incidence, oblique to a line normal to the wafer underside. This requirement is necessary since the wafer must be adhered to the upper surface of a glass plate by a thin transparent layer of an adhesive. When the illumination light is projected onto the underside patterns of the wafer through the glass plate and the thin adhesive layer, a portion of the projected light is undesirably reflected at the lower surface of the glass plate and the interface between the glass plate and the adhesive thin layer. In this case, if the light is projected along optical axis of the lower object lens, the reflected light causes a disturbing glare, so that the observer can not clearly observe the metal-plated patterns. On the other hand, in the case where the object has a perfectly even surface such as a glass plate surface, it is necessary to illuminate the object along the line normal to the object surface. However, in the case where the object has a rough surface such as a non-finished surface of an article plated by a metal such as gold, silver, aluminium, platinum and palladium, even when the object is illuminated at an angel of incidence greater than zero, that is, at an angle oblique to the line normal to the object surface, the image of the object can be observed through the object lens, because the rough surface of the object causes scattering of the light projected thereon, and the observer is thus protected from the glare of the light reflected at the lower surface of the glass plate and the interface between the glass plate and the adhesive layer.

In the art of the present invention, in order to clearly observe the metal-plated patterns on the wafer underside, the light source for the metal-plated patterns is disposed apart from the axis of the lower object lens so that the illumination is carried out at angle of incidence greater than zero.

Figure 5:
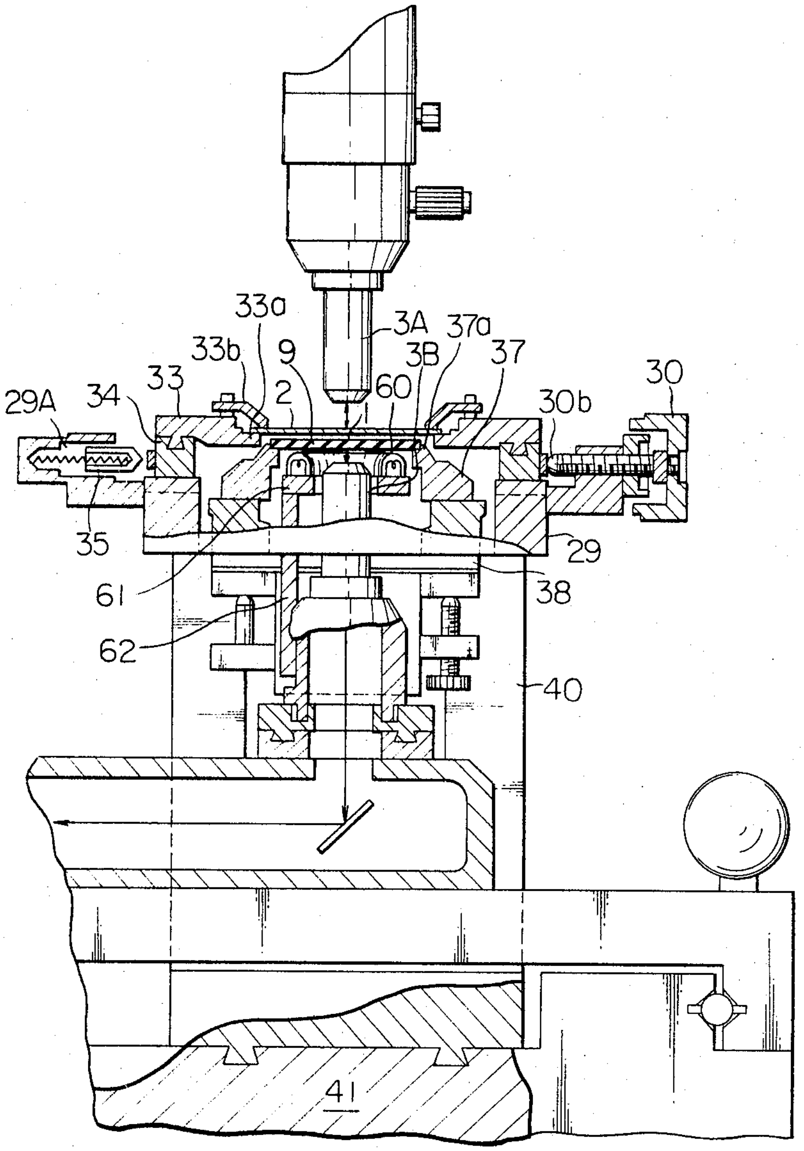
FIG. 5 is a partial side view, partly in section, of another embodiment of the apparatus of the present invention.

Referring to FIG. 1, a light source consisting of two lamps 11 is disposed on an annlular plate 61 surrounding the lower object lens 3B. The annular plate 61 is supported by a rod 62 which is connected with a handle 63 for adjusting the position of the lamps 11. By adjusting the handle 63, the relative position of the lamps 11 with respect to the metal-plated patterns is varied so that the angle of incidence of the illumination light from the lamps 11 is adjusted to the angle at which the image of the metal-plated patterns is most clearly observed. Alternatively, the light source for the metal-plated patterns on the wafer underside may be a single lamp located off the axis of the lower object lnes, or may consist of two or more lamps arranged around the lower object lens, or a circular lamp surrounding the lower object lens. Referring to FIG. 5, a circular lamp 60 is disposed on annular plate 61 as a light source for the metal-plated patterns on the wafer underside.

Figure 2:
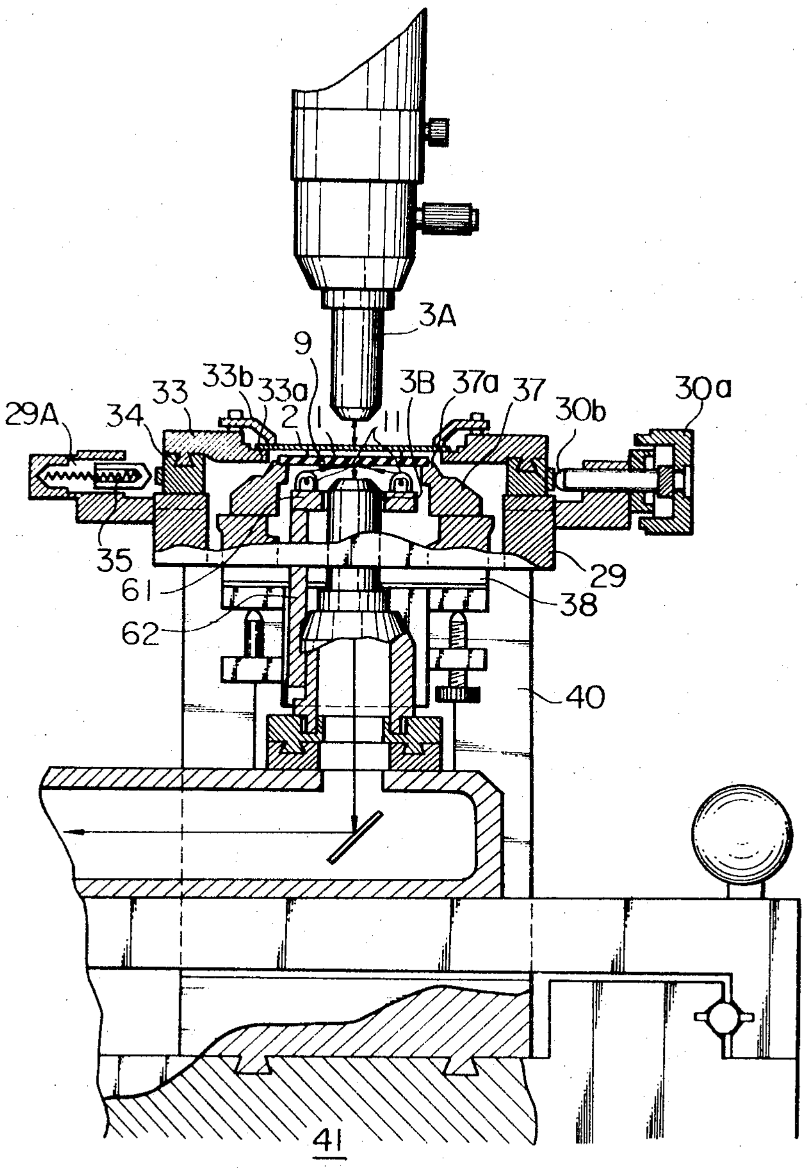
FIG. 2 is a partial side view, partly in section, of the apparatus shown in FIG. 1.
Figure 3:
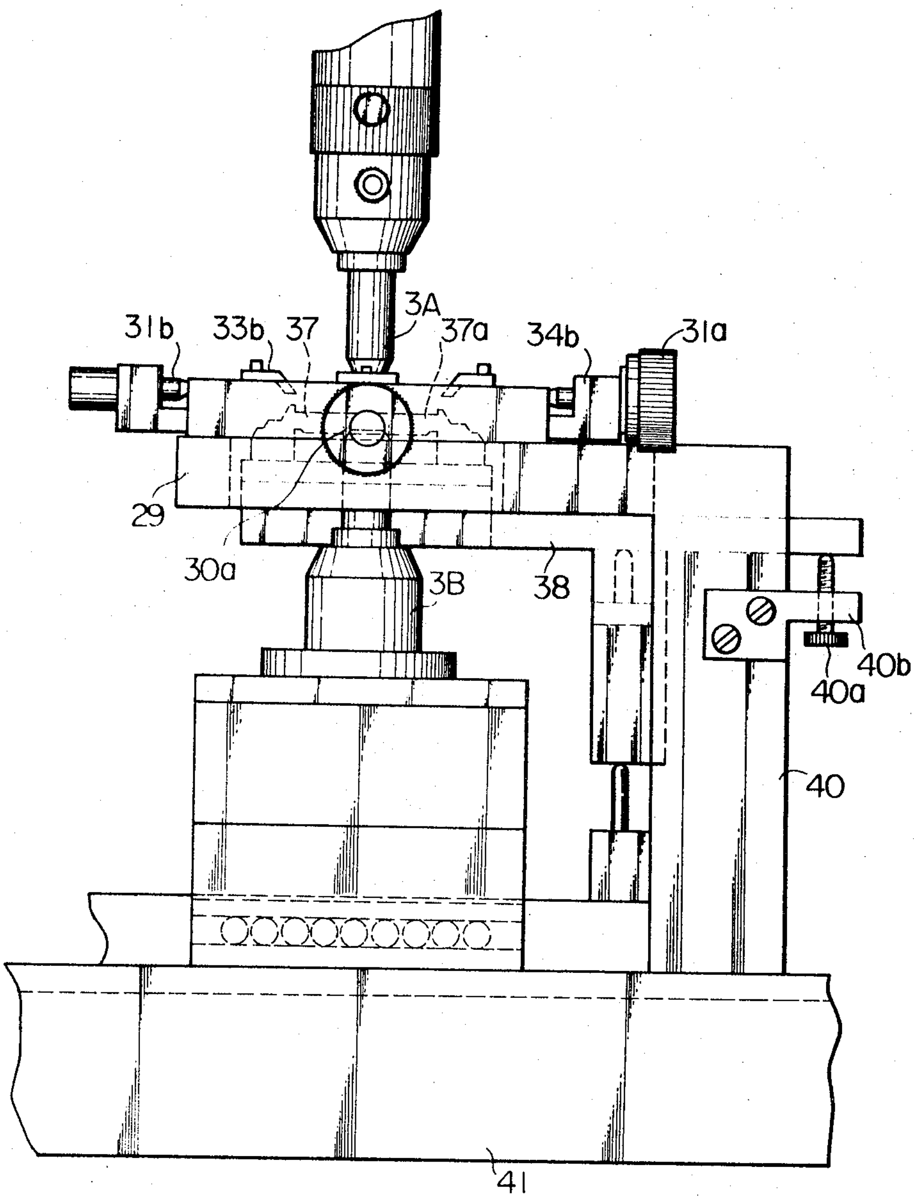
FIG. 3 is a partial front view of the apparatus shown in FIG. 2.

Mechanisms of the device 8 and the displacing means 19 are shown in detail in FIGS. 2 and 3. Referring to FIGS. 2 and 3, the device 8 is rigidly mounted on an upright member 40 of the displacing means 19 which is slidably devetailed with the base 41. The adjusting device 8 comprises a first supporting means for supporting the wafer 1 upon the transparent glass 9 and a second supporting means for supporting the photographic mask 2. The first supporting means comprises a horizontal member 38 slidably dovetailed with the upright member 40 and a ring-shaped supporting element 37 rotatably mounted on the horizontal member 38. The supporting element 37 is provided with a hollow space for permitting an insertion of the object lens 3B and a recess 37a for supporting the transparent glass 9. Furthermore, the adjusting device 8 is provided with a horizontal flange 29 secured to a top portion of the upright member 40 and a ring 34 which is slidably dovetailed with the flange 29 along its dovetail grooves. An adjusting screw 30*a* engages with a projected portion of the flange 29 so that its end portion 30*b* is maintained in contact with the ring 34, and a resilient elememt 35 is mounted on a projected portion of the flange 29 at an opposite position of the ring 34 symmetrical with respect to the adjusting screw 30*a*. The resilient material 35, which constantly bears upon the ring 34 is formed by a helical spring disposed in a hollow 29*a* of the flange 29. The second supporting element 33, is slidably dovetailed with the ring 34 in dovetail grooves so as to enable the element 33 to be displaced perpendicularly as shown in FIG. 2. The supporting element 33 has a ring shape and is provided with a supporting flange 33*a* projected inside and resilient pressers 33*b* which temporarily fix the photographic mask on the supporting element 33. The adjustment of the positon of the photographic mask supporting element 33, with respect to the ring 34, is shown in FIG. 3, where an adjusting screw 31a engages a projected portion 34*b* of the ring 34 and a resilient element 31*b* is disposed to an opposite position of the ring 34 symmetrical with respect to the adjusting screw 31 so as to always press the ring 34 towards the adjusting screw 31*a*. The constructions and functions of the adjusting screw 30*a* and the resilient element 31*b* are similar to that of the adjusting screw 30*a* and the resilient element 35, respectively. Therefore, by turning the adjusting screws 30*a* and 31*a*, the ring 34 and the photographic mask supporting element 33 can be moved perpendicularly. A turning device (not shown) for turning the ring 34 along its axis, is also provided. Further, means for shifting the horizontal member 38 in a perpendicular direction towards the second supporting means is provided. This shifting means is provided with an adjusting screw 40*a* adjustably engaged with a projection 40*b* secured to the upright member 40, as shown in FIG. 3, so that the tip portion of the adjusting screw 40*a* always contacts the horizontal member 38. Therefore, the position of the photographic mask 2 relative to the wafer 1 which is fixedly mounted on the supporting element 37, can be adjusted very easily. After completion of the superposing operation, thefirst supporting means is shifted upwardly by means of turning the adjusting screw 40*a* until the wafer 1 contacts the photographic mask 2. Next, the displacing means 19 is displaced towards the left or right hand side as shown in FIG. 3 along the dovetail grooves of the base 41, whereby the superimposed mask 2 above the wafer 1 is successively carried to a working position of an exposure device.

In the above-mentioned embodiment of the present invention, several modificatins of the apparatus may be made. That is, the reflecting mirror disposed for adjusting the light passage may be omitted by means of turning the semi-transparent mirror through $\pi/2$ radians so as to pick up images of these independent patterns at both sides of the semi-transparent mirror 5, or by changing the positions of the semi-transparent mirror 5 and the reflection mirror 13 with respect to each other. The mirror 18 is disposed at an elongated axis of the upper object lens 3A so that the superposed patterns csn be observed from the right hand side as shown in FIG. 1.

As described above, the purpose of the present invention is attained by a microscope having the above-mentioned construction utilizing simple optical means without applying infrared rays. Therefore, the superposing operation can be carried out very easily and accurately.

The patterns of the wafer may be formed with one or more points or various complex shapes of metal film arranged on the wafer in a prescribed order. Also, the patterns of the photographic mask, to be positioned based on the patterns on the wafer, may be formed in the same shapes as the wafer patterns with an opaque film coated on the glass plate. As already illustrated, in the process of fabricating a semiconductor device, particularly a beam-lead type semiconductor device, the above-mentioned photographic mask is used to carry out the etching operation of a wafer covered with a photosensitive emulsion so as to separate the wafer into elements or to make so-called windows at desired positions of oxide film on the wafer.

The above-mentioned method for superposing patterns can be applied to fabrication of other semiconductor devices without difficulties. The method is further available in the case wherein a non-transparent wafer is used. In other words, application of the above-mentioned method is not substantially limited to the fabrication of the semiconductor device, but may be applied to other opaque wafers. On the other hand, where a transparent slice is used, a focusing operation of the face and back patterns can be carried out separately and accurately to position each pattern separately. Fabrication of an integrated circuit device is carried out according to the following steps:

1. initial oxidizing of the substrate surface in order to form an oxide layer on the substrate surface,
2. forming windows for carrying out the required buried diffusion on the upper surface of the substrate by photoetching the oxide layer, simultaneously forming the windows which are usable as the basic patterns on the underside surface of the substrate,
3. carrying out the buried diffusion operation into the windows,
4. removing the oxide layer,
5. forming the epitaxial layer on the upper surface of the substrate, as a result from this step, the region containing the buried diffusion can not be identified,
6. oxidizing the surface of the epitaxial layer,
7. carrying out desired diffusion operations on the substrate thus treated.

The window-forming operation for this diffusion process is carried out based on the basic patterns formed on the underside surface of the substrate by step (2) according to the present method.

Figure 4:
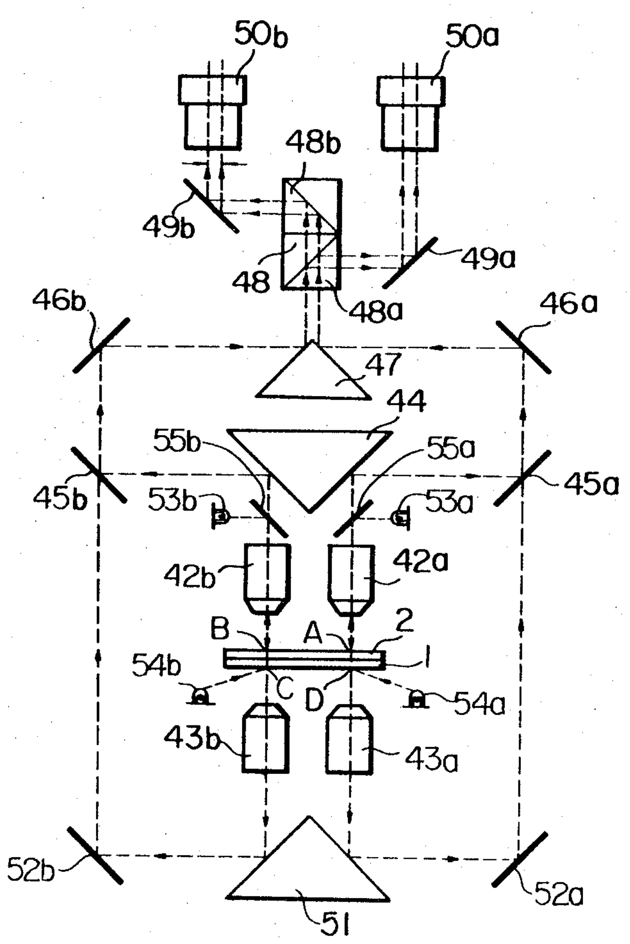
FIG. 4 is a schematic diagram showing the main composition of a modified apparatus according to the present invention.

Referring to FIG. 4, a modified apparatus is provided with two pairs of object lenses including upper right lens 42*a*, upper left lens 42*b*, lower right lens 43*a*, and lower left lens 43*b*, arranged with an intervening horizontal distance, so that two superposed combined images with respect to the respective patterns facing these object lenses can be observed. In other words, the superposing operation can be carried out rapidly and accurately with respect to the two portions of the wafer and the corresponding portions of the photographic mask. The main portion of the apparatus for carrying out the superposing operation is shown in FIG. 4. Two pairs of object lenses 42*a* and 42*b*, and 43*a*, 43*b*, are disposed in the same way as the pair of object lenses 3A and 3B of the first embodiment shown in FIG. 1. Objects A and B of the pattern of the photographic mask 2 are illuminated by the lamps 53*a* and 53*b* through semi-reflecting mirrors 55*a* and 55*b*, and the images A and B are projected to a common reflection prism (45° prism) 44 through optical means in a similar manner to that in the apparatus shown in FIG. 1. The images A and B are reflected by the common prism 44, and further reflected by the semi-reflecting mirrors 45*a* and 45*b*, and reflection mirrors 46*a* and 46*b* disposed symmetrically at their two positions. These images A and B are then projected to a third common half-mirror 48 in a parallel condition after reflection by the second common reflection prism 47. The common half-mirror 48 comprises a first half-mirror 48*a* for reflecting the image toward the right in a direction of 90° with respect to the projected direction thereon, and a second half-mirror 48*b*, reflecting the image toward the left hand in a direction of 90° with respect to the projected direction thereon. The images A and B reflected in the right hand direction by the first half-mirror 48*a* are projected onto an eye piece lens 50*a* disposed to the right. The images A and B reflected in the left hand direction by the second half-mirror 48*b* are respectively projected onto an eye piece lens 50*b* on the left. Therefore, the images A and B, corresponding to the patterns on the photographic mask 2, can be simultaneously caught by the pair of eye piece lenses 50*a* and 50*b*. Objects D and C of the pattern on the underside of the wafer 1 corresponding respectively to the objects A and B on the mask are illuminated by lamps 54*a* and 54*b* located apart from the axes of the right and left lower object lenses 43*a* and 43*b*, respectively. The images D and C are reflected by the common prism 51 and thereafter, reflected by mirrors 52*a* and 52*b*. The reflected images D and C pass through the semi-transparent reflecting glass 45*a* and 45*b* and are then reflected once again by the mirrros 46*a* and 46*b*. Thereafter, images D and C are projected to the eye piece lenses 50*a* and 50*b* through the same paths as the images A and B. Consequently, the combined images of the patterns of the wafer 1 and the photographic mask 2 can be observed very clearly and the superposing operation can be carried out very easily and accurately. In this embodiment, separate optical means positioned in front of the common half-mirror 48 may be used for the images of patterns of the wafer 1 and the photographic mask 2, respectively.

Although specific embodiments of the invention have been described, many modifications and changes may be made therein without departing from the scope of the invention, as defined in the appended claims.

What I claim is:

1. A method for positioning patterns of a photographic mask on the top surface of a wafer with reference to metal plated patterns on the underside of the wafer, comprising the steps of positioning a photographic mask on the top side of a wafer having metal-plated patterns on the underside thereof, supporting said mask and wafer at an intervening position between a pair of axially aligned object lenses which face each other, illuminating said mask patterns with a light beam directed along the optical axis of the object lens which faces said mask, illuminating said metal-plated patterns with light directed at an angle of incidence greater than zero with respect to a line normal to the wafer underside surface, separately focussing said object lenses with respect to a portion of said mask patterns and a portion of said wafer underside patterns corresponding to said portion of said mask patterns to provide separate images on said portions, respectively, magnifying said focussed images to a similar magnitude to each other, combining said magnified images, adjusting the relative position of said focused images by mechanically adjusting the relative position of said photographic mask and said wafer while observing said combined image, thereby to accurately position said mask in relation to the underside metal-plated pattern.

2. A method as claimed in claim 1, in which said angle of incidence of the illumination light for said metal-plated patterns of said wafer is adjusted to the angle at which the image of said metal-plated patterns of said wafer is most clearly observed.

3. Apparatus for positioning patterns of a photographic mask on the top surface of a wafer with reference to metal-plated patterns on the underside of said wafer, comprising a pair of object lenses disposed in a face-to-face relation and aligned along a common extended axis, means for supporting a patterned mask on the top side of said underside patterned wafer and for disposing said mask and wafer at an intervening position between said aligned object lenses, first and second reflection mirror means disposed on the image side and transverse to the optical axis of each of said object lenses for respectively reflecting the projecting images from said object lenses, semi-transparent mirror means for combining said images from said object lenses, an eyepiece lens for enlarging the combined image from said semi-transparent mirror means, a first light source projecting a light beam for illuminating said photographic mask along the optical axis of the object lens which faces the mask, second light source means spaced from said optical axis of the other object lens which faces the wafer for directly illuminating said wafer underside patterns, and means for adjusting the relative position of said photographic mask on said wafer, said adjusting means having means for temporarily fixing said photographic mask on said wafer in a contacting condition.

4. Apparatus as claimed in claim 3, further comprising means for adjusting the position of said second light source means.

5. Apparatus as claimed in claim 3, in which said means for disposing the underside patterned wafer at an interveining position between said object lenses includes a glass plate for receiving said wafer thereon.

6. Apparatus as claimed in claim 3, wherein said second light source means for said wafer underside patterns comprises at least one lamp spaced from said common axis of said object lenses.

7. Apparatus as claimed in claim 3, further comprising means for removing said wafer and mask from their intervening position between said object lenses, while said photographic mask is temporarily fixed to said wafer by said adjusting means removing said wafer and mask from their intervening position between said object lenses.

8. Appparatus as claimed in claim 3, wherein said second light source means for said wafer underside portions is a circular lamp.

9. Apparatus for positioning patterns of a phototgraphic mask on the top surface of a wafer with reference to metal-plated patterns on the underside of the wafer, comprising left and right pairs of upper and lower object lenses, said lenses of each respective pair disposed in a face-to-face aligned position and arranged side by side with the other said pair of lenses with an equal space between the lenses of each said pair, means for supporting a patterned mask on the top side of an underside-patterned wafer and for disposing said mask and wafer at an intermediate position in said space between the lenses of said pairs of lenses, a first means for illuminating said patterned mask along optical axes of said right and left upper object lenses, a second illuminating means disposed off said optical axes of said right and left lower object lenses for directly illuminating the underside of said patterned wafer, means for projecting images from said object lenses, means for combining said images from each respective pair of said object lenses, means for adjusting the relative position of said photographic mask on said wafer, a pair of eyepiece lenses, means for collecting said combined images in the visual field of said eyepiece lenses so that the left half area of said visual field of each eyepiece lens receives the combined image of said left pair of object lenses, while the right half area of said visual fiedl of each eyepiece lens recives the combined image of said right pair of object lenses.

10. Apparatus as claimed in claim 9, in which said collecting means comprises a first common prism means disposed at a position for reflecting images from said object lenses so that the images from said right object lenses are reflected toward the right hand side while the images from said left object lenses are reflected toward the left hand side, a second common prism means disposed at a position for refelcting images from said first common prism means toward said eyepiece lenses so that said images reflected by said second common prism means are in the visible field of each of said eyepiece lenses, means for reflecting the images reflected by said first common prism means towards said second prism means, and means for separately reflecting the respective left and right combined images reflected by said second common prism means towards said eyepiece lenses.

11. Apparatus as claimed in claim 10, in which said means for separately reflecting said respective combined left and right images reflected from said second common prism means towards said eyepiece lenses includes two semi-reflecting mirrors positioned side-by-side.

12. Apparatus as claimed in claim 9, in which said adjusting means includes means for temporarily fixing said photographic mask to said wafer in an aligned position, and further comprising means for moving said adjusting means to remove said mask and wafer from their intervening position between said object lenses.

* * * * *

UNITED STATES PATENT OFFICE
CERTIFICATE OF CORRECTION

Patent No. 3,752,589 Dated August 14, 1973

Inventor(s) Masaaki KOBAYASHI

It is certified that error appears in the above-identified patent and that said Letters Patent are hereby corrected as shown below:

In the Heading to the Patent, Item [76]

change "Sagoa" to --Sugao--.

Signed and sealed this 15th day of October 1974.

(SEAL)
Attest:

McCOY M. GIBSON JR.
Attesting Officer

C. MARSHALL DANN
Commissioner of Patents